(12) United States Patent
Fuller et al.

(10) Patent No.: US 7,811,926 B2
(45) Date of Patent: *Oct. 12, 2010

(54) MULTILAYER HARDMASK SCHEME FOR DAMAGE-FREE DUAL DAMASCENE PROCESSING OF SICOH DIELECTRICS

(75) Inventors: Nicholas C. M. Fuller, Elmsford, NY (US); Stephen McConnell Gates, Ossining, NY (US); Timothy J. Dalton, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/198,602

(22) Filed: Aug. 26, 2008

(65) Prior Publication Data

US 2008/0311744 A1 Dec. 18, 2008

Related U.S. Application Data

(60) Continuation of application No. 11/873,936, filed on Oct. 17, 2007, now Pat. No. 7,439,174, which is a division of application No. 11/034,480, filed on Jan. 13, 2005, now Pat. No. 7,371,461.

(51) Int. Cl.
*H01L 21/00* (2006.01)
(52) U.S. Cl. .................. 438/622; 438/624; 438/706
(58) Field of Classification Search ............ 438/622, 438/624, 706
See application file for complete search history.

(56) References Cited

U.S. PATENT DOCUMENTS

| 6,140,226 | A | 10/2000 | Grill et al. | |
|---|---|---|---|---|
| 6,720,249 | B1 * | 4/2004 | Dalton et al. | 438/624 |
| 6,797,552 | B1 | 9/2004 | Chang et al. | |
| 7,030,031 | B2 * | 4/2006 | Wille et al. | 438/725 |
| 7,033,960 | B1 | 4/2006 | You et al. | |
| 7,109,101 | B1 | 9/2006 | Wright et al. | |
| 7,115,993 | B2 | 10/2006 | Wetzel et al. | |
| 7,326,651 | B2 * | 2/2008 | Baks et al. | 438/706 |
| 7,371,461 | B2 * | 5/2008 | Fuller et al. | 428/446 |
| 7,439,174 | B2 * | 10/2008 | Dalton et al. | 438/622 |
| 2004/0061227 | A1 | 4/2004 | Gao et al. | |
| 2004/0266201 | A1 * | 12/2004 | Wille et al. | 438/706 |
| 2005/0079701 | A1 * | 4/2005 | Baks et al. | 438/622 |
| 2006/0154086 | A1 * | 7/2006 | Fuller et al. | 428/428 |
| 2007/0161226 | A1 * | 7/2007 | Dalton et al. | 438/622 |
| 2008/0038917 | A1 * | 2/2008 | Dalton et al. | 438/624 |

* cited by examiner

*Primary Examiner*—Laura M Menz
(74) *Attorney, Agent, or Firm*—Scully, Scott, Murphy & Presser, P.C.; Louis J. Percello, Esq.

(57) ABSTRACT

Interconnect structures possessing an organosilicate glass based material for 90 nm and beyond BEOL technologies in which a multilayer hardmask using a line-first approach are described. The interconnect structure of the invention achieves respective improved device/interconnect performance and affords a substantial dual damascene process window owing to the non-exposure of the OSG material to resist removal plasmas and because of the alternating inorganic/organic multilayer hardmask stack. The latter feature implies that for every inorganic layer that is being etched during a specific etch step, the corresponding pattern transfer layer in the field is organic and vice-versa.

12 Claims, 10 Drawing Sheets

US 7,811,926 B2

MULTILAYER HARDMASK SCHEME FOR DAMAGE-FREE DUAL DAMASCENE PROCESSING OF SICOH DIELECTRICS

RELATED APPLICATIONS

This application is a continuation of U.S. patent application Ser. No. 11/873,936, filed Oct. 17, 2007, which is a divisional of U.S. patent application Ser. No. 11/034,480, filed Jan. 13, 2005, now U.S. Pat. No. 7,371,461.

FIELD OF THE INVENTION

The present invention generally relates to integrated circuits (ICs), and more particularly to interconnect structures, including multilevel interconnect structures, in which a multilayer hardmask patterning technique is employed to enable (i) negligible interlevel dielectric (ILD) modification (i.e., damage) during patterning and (ii) a sufficient dual damascene processing window; thus facilitating improved interconnect/device performance, reliability, and functionality.

BACKGROUND OF THE INVENTION

Generally, semiconductor devices include a plurality of circuits that form an IC including chips (e.g., chip back end of line, or "BEOL"), thin film packages and printed circuit boards. Integrated circuits can be useful for computers and electronic equipment and can contain millions of transistors and other circuit elements that are fabricated on a single silicon crystal substrate. For the device to be functional, a complex network of signal paths will normally be routed to connect the circuit elements distributed on the surface of the device. Efficient routing of these signals across the device can become more difficult as the complexity and number of integrated circuits are increased. Thus, the formation of multilevel or multi-layered interconnection schemes such as, for example, dual damascene wiring structures, have become more desirable due to their efficacy in providing high speed signal routing patterns between large numbers of transistors on a complex semiconductor chip. Within the interconnection structure, metal vias run perpendicular to the silicon substrate and metal lines run parallel to the silicon substrate.

Presently, interconnect structures formed on an integrated circuit chip consists of at least about 2 to 8 wiring levels fabricated at a minimum lithographic feature size designated about 1× (referred to as "thinwires") and above these levels are about 2 to 4 wiring levels fabricated at a width equal to about 2× and/or about 4× the minimum width of the thinwires (referred to as "fatwires"). In one class of structures, the thinwires are formed in a low dielectric constant (k) organosilicate interlevel dielectric (ILD) layer, such as a carbon doped oxide material including elements of Si, C, H and O (SiCOH), and the fatwires are made in a silicon dioxide ILD having a dielectric constant of about 4. The low k organosilicate ILDs typically have a dielectric constant of less than 3.7. In other structures, either 1× or 2× and/or 4× wires are made in an ultralow dielectric constant (ULK) SiCOH dielectric with k less than 2.6.

For given integration strategies, one of the major challenges associated with the fabrication of thin and fatwires for 90 nm and beyond CMOS BEOL technologies is the issue of ash induced modification of the organosilicate glass (OSG) based ILD materials during damascene processing. This ashing step occurs subsequent to the via (trench) definition in the prior art etching processes. Since the via (trench) structure has already been defined (i.e., created), the chemistry employed to remove the photoresist or other organic material that served as the pattern transfer layer is capable of chemically and physically interacting with the exposed OSG ILD material in the via (trench) structure. Further, since the Si—C (Si—CH$_x$; x=1 to 3) bond of these dense OSG type materials is readily broken, processes known as "de-methylation" or carbon removal by oxygen, nitrogen or hydrogen species can readily occur. These carbon removal reactions are typically energetically favorable and kinetically rapid. ILD modification during the ash process is thus critical, and is very critical for ULK dielectrics.

Because of this issue, several alternative integration schemes have been proposed that circumvent the issue of ash-induced dielectric modification. One such prior art method is disclosed in U.S. Pat. No. 6,734,096 to Dalton, et al. Briefly, in this prior art scheme, the line level is patterned first and subsequently partially defined with the employed photoresist serving as the pattern transfer layer. FIG. 1 is a cross sectional view of an interconnect structure 10 including a trilayer hardmask 18, an antireflective coating 26 and a patterned photoresist 28, in accordance with the disclosure of the '096 patent. As shown, the interconnect structure 10 includes a first dielectric layer 12, a diffusion barrier layer 14 such as a material including elements of C, Si, N and H and a second dielectric layer 16 comprising a low k dielectric material such as an OSG ILD. The trilayer hardmask 18 includes a capping layer 20 comprising elements of Si, C, O and H, a silicon nitride layer 22, and a metallic nitride layer 24, such as TiN or TaN. The patterned photoresist 28 is subsequently removed with the ILD still protected by the metallic nitride layer 24 of the trilayer hardmask 18. A similar procedure is repeated for the via-level with the resist material being removed subsequent to opening the hardmask stack whereby the ILD is again protected by the hardmask layers. The metallic nitride layer 24 of the trilayer hardmask 18 now serves as the pattern transfer layer for the remainder of the dual damascene process; defining the line and via structures. The metallic nitride layer 24 disclosed in the '096 patent offers potential "etch resistance", sufficient lithography process window, and is re-workable. Such an integration scheme is indeed truly beneficial for avoiding ILD damage due to exposure to various plasma ash chemistries.

However, there are at least 3 problems with the prior art technique disclosed in the '096 patent. First, the etch resistance of the metallic nitride layer 24 is typically insufficient for providing substantial process window in a manufacturing environment. Though one can achieve an excess of 1:1 selectivity for the hardmask layers and SiCOH-based ILD relative to the metallic nitride layer 24, to enable lithography the metallic nitride layer 24 disclosed in the '096 patent must be thin (on the order of about 35 nm or less) and retention of this relatively thin layer is challenging and is nearly impossible. Second, the metal nitride layer 24 is costly to deposit. Third, chlorine-based etch chemistry and metal contaminated etch chambers must be dedicated to pattern the metallic nitride layer 24 of the prior art trilayer hardmask 18. The prior art technique disclosed in the '096 patent avoids ILD damage, but is costly, requires dedicated etch tools, and does not provide a large dual damascene process window.

In view of the above, there is a need to provide a method that circumvents the issue of ash-induced dielectric modification of OSG ILDs, yet circumvents the problems that are inherently present in the '096 patent.

SUMMARY OF THE INVENTION

One object of the present invention is to provide an interconnect structure of, e.g., the dual damascene type, in which a multilayer hardmask is utilized during dual damascene processing.

A further object of the present invention is to provide an interconnect structure in which the multilayer hardmask includes alternating material types (organic/inorganic).

A yet further object of the present invention is to provide an interconnect structure in which the organic layer in the hardmask stack is a chemical vapor deposited (CVD) dielectric type film capable of undergoing subsequent chemical mechanical planarization.

An even further object of the present invention is to provide an interconnect structure in which there is negligible ILD modification, even for ULK SiCOH dielectrics.

A still further object of the present invention is to provide an interconnect structure formed by a dual damascene process that has a large dual damascene etch process window. A large process window facilitates creation of the dual damascene structure irrespective of variations in film thickness and etch rate variations due to tool condition, in addition to across wafer, wafer-to-wafer, lot-to-lot, and tool-to-tool variations.

Another object of the present invention is to provide an interconnect structure that has improved performance, reliability, and functionality.

These and other objects and advantages are achieved in the present invention by providing a multilayer hardmask on a surface of an OSG ILD and utilizing the inventive hardmask in forming the metal lines and via lines within the OSG ILD, i.e., during pattern transfer. Unlike the prior art technique described in the '096 patent, the inventive hardmask does not include an upper layer that comprises a metallic nitride. Specifically, and in broad terms, the present invention thus provides a multilayer hardmask useful for patterning an OSG ILD that comprises:

an organic material layer; and
a first Si-containing inorganic material layer located atop the organic material layer, wherein said first Si-containing inorganic layer comprises a stack of at least an oxide overlayer and a nitride underlayer.

In some embodiments of the present invention, a second Si-containing inorganic layer is employed and the organic material layer is located on a surface of the second Si-containing inorganic layer.

It is observed that the inventive multilayer hardmask comprises at least one alternating material type, i.e., inorganic (overlayer)/organic (underlayer). This feature of the inventive hardmask implies that for every inorganic layer that is being etched during a specific etch step, the corresponding pattern transfer layer in the field is organic and vice-versa.

In addition to the multilayer hardmask, the present invention provides a structure that includes at least the inventive multilayer hardmask as a material component within an interconnect structure. Specifically, and in broad terms, the inventive structure comprises:

at least one organosilicate glass (OSG) interlayer dielectric (ILD); and
a multilayer hardmask located on a surface of the OSG ILD, said multilayer hardmask comprising an organic material layer, and a first Si-containing inorganic material layer located atop the organic material layer, wherein said first Si-containing inorganic layer comprises a stack of at least an oxide overlayer and a nitride underlayer.

In some embodiments of the present invention, a second Si-containing inorganic material layer is employed and it is located between the OSG ILD and the organic material layer.

The present invention also provides a process for damage-free patterning of an OSG ILD which includes the steps of:

forming a structure comprising a multilayer hardmask on a surface of an OSG ILD, said multilayer hardmask comprising an organic material layer, and a first Si-containing inorganic material layer located atop the organic material layer, wherein said first Si-containing inorganic layer comprises a stack of at least an oxide overlayer and a nitride underlayer;

forming a first opening defining a partial line pattern in said oxide overlayer, wherein said first opening exposes a portion of said nitride underlayer;

conditioning the exposed portion of said nitride underlayer to prevent resist poisoning;

forming a second opening defining a via pattern through said exposed portion of the nitride underlayer, said organic material layer and a portion of said OSG ILD;

completing the line pattern by removing said nitride overlayer, said organic material layer, and a portion of said OSG ILD that is adjacent to said via pattern;

deepening the via pattern through said OSG ILD; and filling said via and line patterns within said OSG ILD with at least a conductive material.

In some embodiments of the inventive method, the multilayer hardmask also includes a second Si-containing inorganic layer that is located between said organic material layer and said OSG ILD.

In yet another embodiment of the present invention, the OSG ILD is a stack comprising a first OSG material and a second OSG material that are separated by a buried etch stop layer.

In all embodiments of this invention, the OSG ILD may be porous or nonporous.

DETAILED DESCRIPTION OF THE INVENTION

Figure 1:
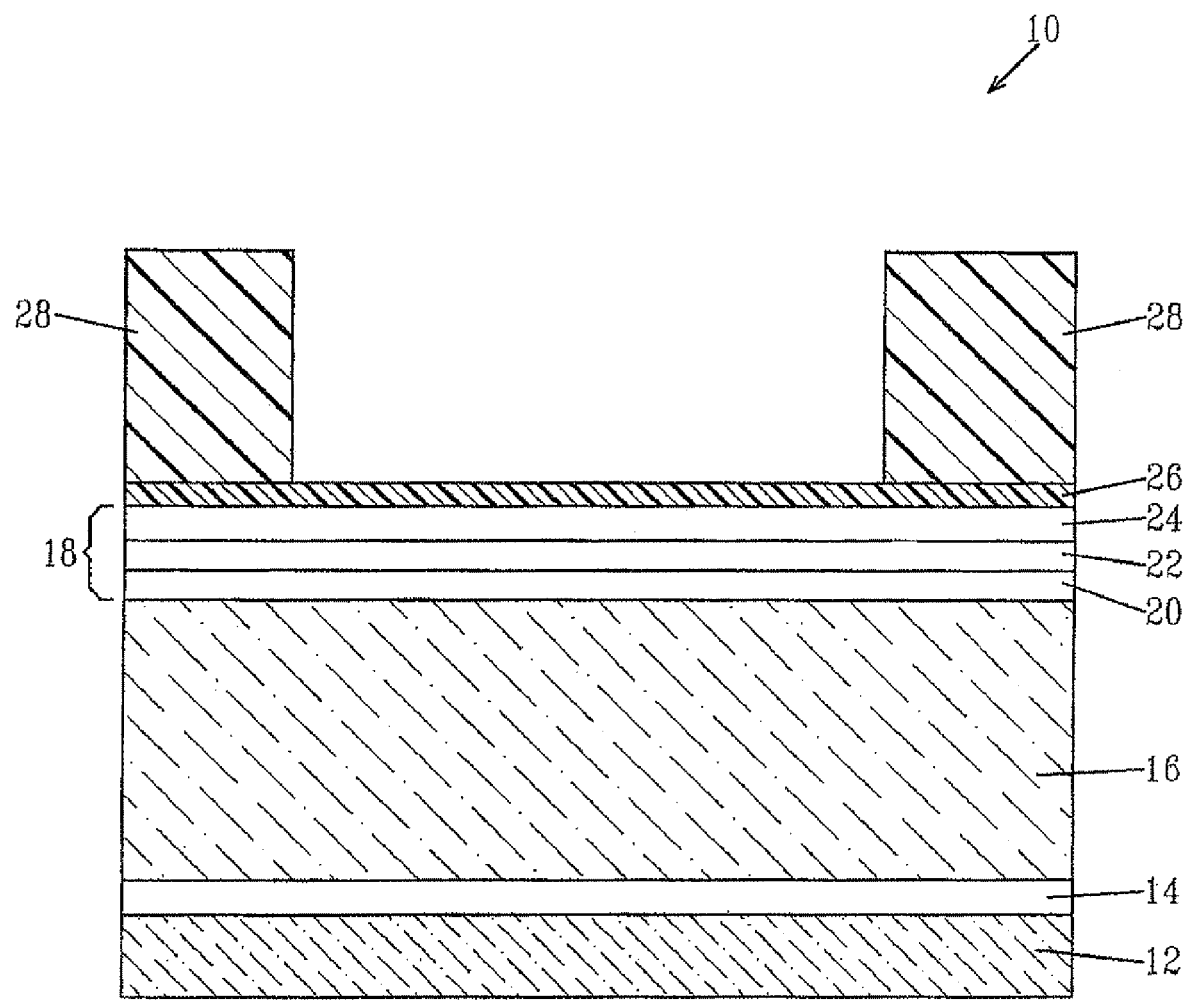
FIG. 1 is a pictorial representation (through a cross sectional view) illustrating a prior structure that utilizes the technology disclosed in U.S. Pat. No. 6,734,096.

The present invention, which provides a multilayer hardmask technique for damage-free processing of OSG ILDs, will now be described in greater detail by referring to the drawings that accompany the present application. The drawings are provided herein for illustrative purposes and thus they are not drawn to scale.

The present invention which is directed to an interconnect structure useful for forming a semiconductor device, is such that a multilayer hardmask stack integration scheme is utilized to fabricate conductive/low-k interconnect structures of negligible plasma-induced dielectric modification and a substantial dual damascene process window. The interconnect structure of the present invention offers improved performance, reliability, and functionality. The integration scheme is such that an alternating hardmask stack scheme is employed including inorganic and organic type layers. Such a scheme in which the dual damascene process flow commences with definition of the line structure followed by that of the via and the line occurring simultaneously facilitates exposure of the dielectric to the etch chemistries only and not to any resist removal type plasmas. This feature coupled with the alternating organic/inorganic type stack enables respective minimal ILD damage and a substantial dual damascene process window.

Reference is first made to FIGS. 2A to 2J which illustrate a first processing scheme of the present invention. In this embodiment, the multilayer hardmask 54 includes, in order from bottom to top, a second Si-containing inorganic layer 56, an organic material layer 58, and a first Si-containing inorganic layer 60 comprising a nitride underlayer 62 and an oxide overlayer 64.

Figure 2A:
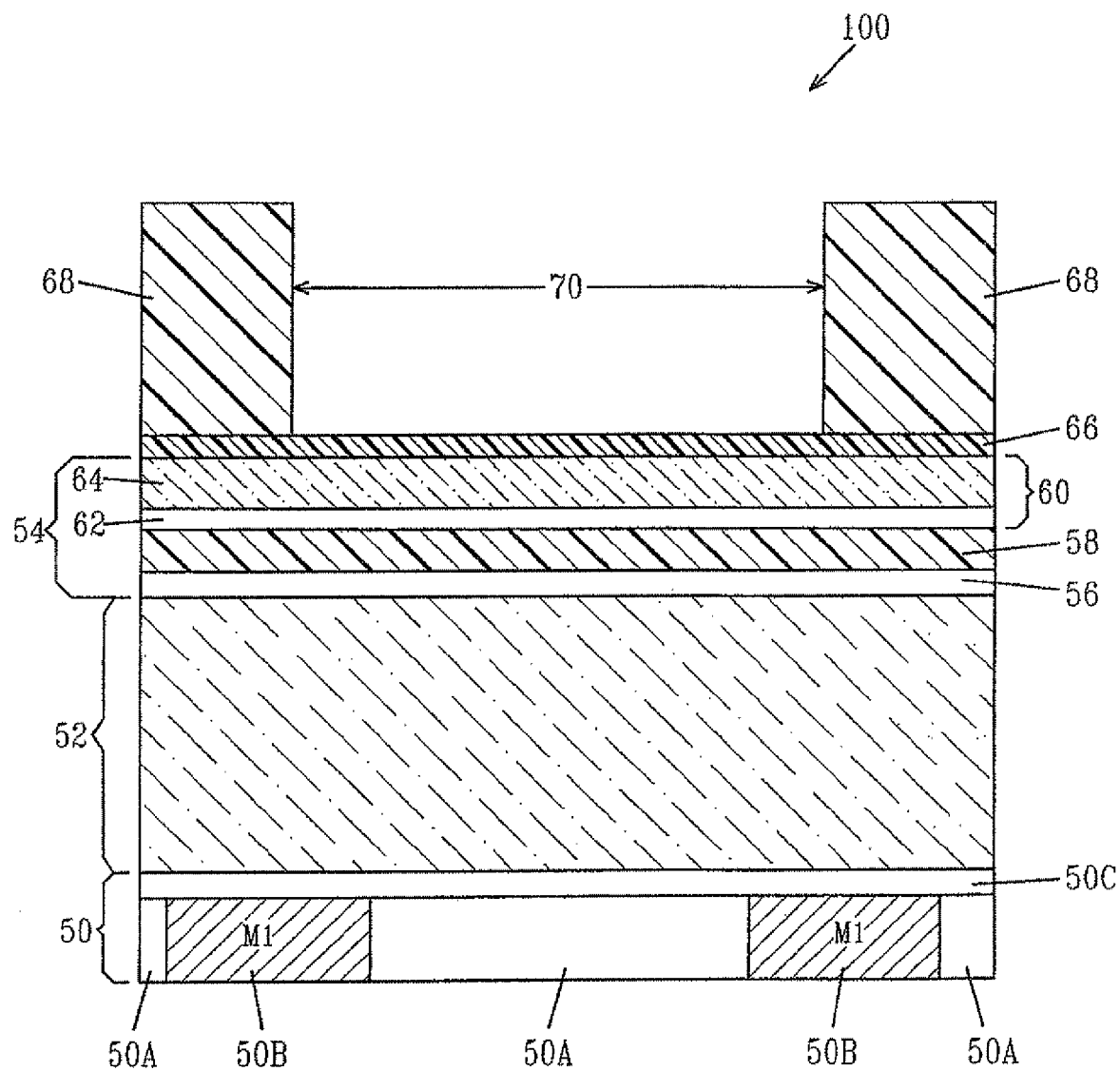
FIGS. 2A-2J are pictorial representations (though cross sectional views) illustrating the basic processing scheme of a first embodiment of the present invention in which a multilayer hardmask comprising four layers is employed.

This embodiment of the present invention begins by first providing the structure 100 shown in FIG. 2A. The structure 100 shown in FIG. 2A comprises a substrate 50, an OSG ILD 52 located atop the substrate 50, the inventive multilayer hardmask 54 located atop the OSG ILD 52, a first antireflective coating 66 and a patterned photoresist 68.

The term "substrate" when used in conjunction with substrate 50 includes a semiconducting material, an insulating material, a conductive material or any combination thereof including multilayered structures. Thus, for example, substrate 50 can be a semiconducting material such as Si, SiGe, SiGeC, SiC, GaAs, InAs, InP and other III/V or II/VI compound semiconductors. The semiconductor substrate 50 can also include a layered substrate such as, for example, Si/SiGe, Si/SiC, silicon-on-insulators (SOIs) or silicon germanium-on-insulators (SCOIs).

When substrate 50 is an insulating material, the insulating material can be an organic insulator, an inorganic insulator or a combination thereof including multilayers. When the substrate 50 is a conductive material, the substrate 50 may include, for example, polySi, an elemental metal, alloys of elemental metals, a metal silicide, a metal nitride and combinations thereof including multilayers.

In some embodiments, the substrate 50 includes a combination of a semiconducting material and an insulating material, a combination of a semiconducting material and a conductive material or a combination of a semiconducting material, an insulating material and a conductive material.

When the substrate 50 comprises a semiconductor material, one or more semiconductor devices such as complementary metal oxide semiconductor (CMOS) devices can be fabricated thereon. For clarity, the one or more semiconductor devices are not shown in the drawings of the present application.

In the specific embodiment illustrated in FIG. 2A, the substrate 50 comprises an insulating layer 50A having conductive features, i.e., metal lines M1, 50B located therein. The substrate 50 further includes a diffusion barrier 50C such as a dielectric comprising elements of Si, C, N, O and H. The substrate 50 including elements 50A, 50B and 50C is fabricated using techniques well known in the art including, for example, deposition of insulating layer 50A, patterning the insulating layer 50A via lithography and etching, filling the patterned insulating layer 50A with a conductive material providing region 50B, and forming the diffusion barrier 50C thereon.

The OSG ILD 52 comprises a single layer or multilayer dielectric material having a dielectric constant of about 3.7 or less. Preferably, the OSG ILD 52 has a dielectric constant of less than about 2.8, with a dielectric constant of less than about 2.6 being more highly preferred (ULK). The OSG ILD 52 can be porous or nonporous. When porous dielectric films are employed, the dielectric constant thereof is less than the nonporous version of the same dielectric film. Preferably, the OSG ILD 52 is a porous material.

Examples of OSG dielectrics forming OSG ILD 52 that can be employed in the present invention include, but are not limited to silicon-containing materials such as a composition of Si, C, O and H (SiCOH) also called C doped oxide (CDO), and organosilicate glass (OSG).

The OSG ILD 52 is typically deposited using plasma enhanced chemical vapor deposition (PECVD). In addition to PECVD, the present invention also contemplates that the OSG ILD 52 can be formed utilizing chemical vapor deposition (CVD), high-density plasma (HDP) deposition, pulsed PECVD, spin-on application, or other related methods. The thickness of the OSG ILD 52 deposited may vary; typical ranges for the deposited OSG ILD 52 are from about 50 nm to about 1 μm, with a thickness from 100 to about 600 nm being more typical.

Typically, the OSG ILD 52 is a SiCOH dielectric that is deposited using the processing techniques disclosed in co-assigned U.S. Pat. Nos. 6,147,009, 6,312,793, 6,441,491, 6,437,443, 6,441,491, 6,541,398, 6,479,110 B2, and 6,497,963, the contents of which are incorporated herein by reference.

Specifically, the SiCOH dielectric film is formed by providing at least a first precursor (liquid, gas or vapor) comprising atoms of Si, C, O, and H, and an inert carrier such as He or Ar, into a reactor, preferably the reactor is a PECVD reactor, and then depositing a film derived from said first precursor onto a suitable substrate utilizing conditions that are effective in forming a SiCOH dielectric material. The present invention yet further provides for mixing the first precursor with an oxidizing agent such as $O_2$, $CO_2$ or a combination thereof thereby stabilizing the reactants in the reactor and improving the uniformity of the OSG ILD 52 deposited on the substrate 50.

In addition to the first precursor, a second precursor (gas, liquid or vapor) comprising atoms of C, H, and optionally O, F and N can be used. Optionally, a third precursor (gas, liquid or gas) comprising Ge may also be used.

Preferably, the first precursor is selected from organic molecules with ring structures comprising SiCOH components such as 1, 3, 5, 7-tetramethylcyclotetrasiloxane ("TMCTS" or "$C_4H_{16}O_4Si_4$"), octamethylcyclotetrasiloxane (OMCTS), diethoxymethylsilane (DEMS), dimethyldimethoxysilane (DMDMOS), diethylmethoxysilane (DEDMOS), and related cyclic and non-cyclic silanes, siloxanes and the like.

The second precursor that may be used in forming a SiCOH low k dielectric is a hydrocarbon molecule. Although any hydrocarbon molecule such as, for example, ethylene, may be used, preferably the second precursor is selected from the group consisting of hydrocarbon molecules with ring structures, preferably with more than one ring present in the molecule or with branched chains attached to the ring. Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics, such as cyclopentene oxide ("CPO" or "$C_5H_8O$"). Also useful are molecules containing branched tertiary butyl (t-butyl) and isopropyl (i-propyl) groups attached to a hydrocarbon ring; the ring may be saturated or unsaturated (containing C=C double bonds), and multicyclic hydrocarbons such as bicycloheptadiene. The third precursor may be formed from germane hydride or any other reactant comprising a source Ge.

In a preferred embodiment of the present invention, the SiCOH dielectric film, which is used as the OSG ILD 52, may be deposited using a method the includes the step of providing a parallel plate reactor, which has a conductive area of a substrate chuck between about 85 $cm^2$ and about 750 $cm^2$, and a gap between the substrate and a top electrode between about 1 cm and about 12 cm. A high frequency RF power is applied to one of the electrodes at a frequency between about 0.45 MHz and about 200 MHz. Optionally, an additional low frequency power can be applied to one of the electrodes.

The conditions used for the deposition step may vary depending on the desired final dielectric constant of the SiCOH dielectric film. Broadly, the conditions used for providing a stable dielectric material comprising elements of Si, C, O and H that has a dielectric constant of about 2.8 or less include: setting the substrate temperature at between about 200° C. and about 425° C.; setting the high frequency RF power density at between about 0.1 $W/cm^2$ and about 2.5 $W/cm^2$; setting the first liquid precursor flow rate at between about 100 mg/min and about 5000 mg/min, optionally setting the second liquid precursor flow rate at between about 50 mg/min to about 10,000 mg/min; optionally setting the third liquid precursor flow rate at between about 25 mg/min to about 4000 mg/min; optionally setting the inert carrier gases such as helium (and/or argon) flow rate at between about 50 seem to about 5000 sccm; setting the reactor pressure at a pressure between about 1000 mTorr and about 7000 mTorr; and setting the high frequency RF power between about 75 W and about 1000 W. Optionally, a low frequency power may be added to the plasma between about 30 W and about 400 W. When the conductive area of the substrate chuck is changed by a factor of X, the RF power applied to the substrate chuck is also changed by a factor of X.

When an oxidizing agent is employed in the present invention, it is flown into the PECVD reactor at a flow rate between about 10 sccm to about 1000 sccm.

While liquid precursors are used in the above example, it is known in the art that the organosilicon gas phase precursors (such as trimethylsilane) can also be used for the deposition. A porogen can be included during the deposition of OSG ILD 52 that causes subsequent pore formation within the OSG dielectric film 52 during a subsequent curing step. The curing of the OSG dielectric film can be after deposition of the OSG ILD 52, or after deposition of the inventive hardmask 54.

In a preferred embodiment of the present invention, the OSG ILD 52 formed at this point of the present invention contains a matrix of a hydrogenated oxidized silicon carbon material (SiCOH) comprising atoms of Si, C, O and H in a covalently bonded tri-dimensional network and having a dielectric constant of not more than about 2.8. The tri-bonded network may include a covalently bonded tri-dimensional ring structure comprising Si—O, Si—C, Si—H, C—H and C—C bonds.

The OSG ILD 52 may comprise F and N and may optionally have the Si atoms partially substituted by Ge atoms. The OSG ILD 52 may contain molecular scale voids (i.e., nanometer-sized pores) of between about 0.3 to about 50 nanometers in diameter, and most preferably between about 0.4 and about 10 nanometers in diameter, further reducing the dielectric constant of the OSG ILD 52 to values below about 2.0. The nanometer-sized pores of the OSG ILD 52 occupy a volume of between about 0.5% and about 50% of a volume of the material.

When the OSG ILD 52 is a SiCOH dielectric, it typically comprises between about 5 and about 40 atomic percent of Si; between about 5 and about 45 atomic percent of C; between 0 and about 50 atomic percent of O; and between about 10 and about 55 atomic percent of H.

After forming the OSG ILD 52 on the substrate 50, the inventive multiplayer hardmask 54 is then formed atop the OSG ILD 52. The multilayer hardmask 54 can be formed in the same reactor chamber, with or without breaking vacuum, as that used to form the OSG ILD 52. Alternatively, different reactor chambers using at least one different deposition process as that of the OSG ILD 52 can be used in forming the inventive multilayer hardmask 54. It is noted that in one embodiment, the inventive hardmask 54 and the OSG ILD 52 are formed in a same reactor chamber, without breaking vacuum between depositions.

In the embodiment illustrated, the multilayer hardmask 54 includes, in order from bottom to top, a second Si-containing inorganic layer 56, an organic material layer 58, and a first Si-containing inorganic layer containing 60 comprising a nitride underlayer 62 and an oxide overlayer 64.

The second Si-containing inorganic layer 56 of the inventive hardmask 54 is comprised of atoms of Si, C and H and optionally O. Preferably, the second Si-containing inorganic layer 56 comprises a SiCOH material. Alternatively, layer 56 can comprise a SiCH material or a combination of SiCOH and SiCH. The second Si-containing inorganic layer 56 is optional and is not needed in all instances; see, for example, FIGS. 4A and 4B. When employed, the second Si-containing inorganic layer 56 serves as a hardmask for the OSG ILD 52. The second Si-containing inorganic layer 56 has a thickness that is typically from about 10 to about 300 nm, with a thickness from about 10 to about 100 nm being even more typical. Typically, the second Si-containing inorganic layer 56 of the inventive hardmask 54 comprises from about 10 to about 80 atomic % C, from about 10 to about 80 atomic % Si, from about 5 to about 40 atomic % H and optionally from about 5 to about 40 atomic % O. When N is present, it typically is present in an amount from about 5 to about 40 atomic %. When present, the second Si-containing inorganic layer 56 is formed utilizing materials and the technique as described above for the OSG ILD 52.

Figure 4A:
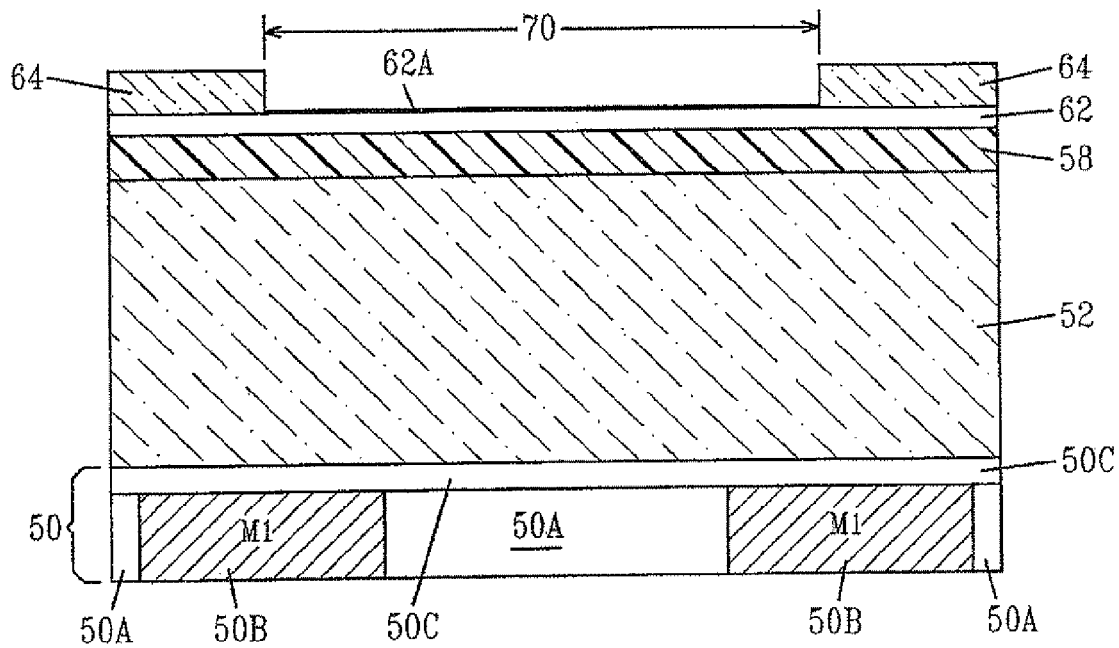
FIGS. 4A-4B are pictorial representations (through cross sectional views) illustrating processing steps employed in a third embodiment of the present invention in which a hardmask comprising three layers is employed.
Figure 4B:
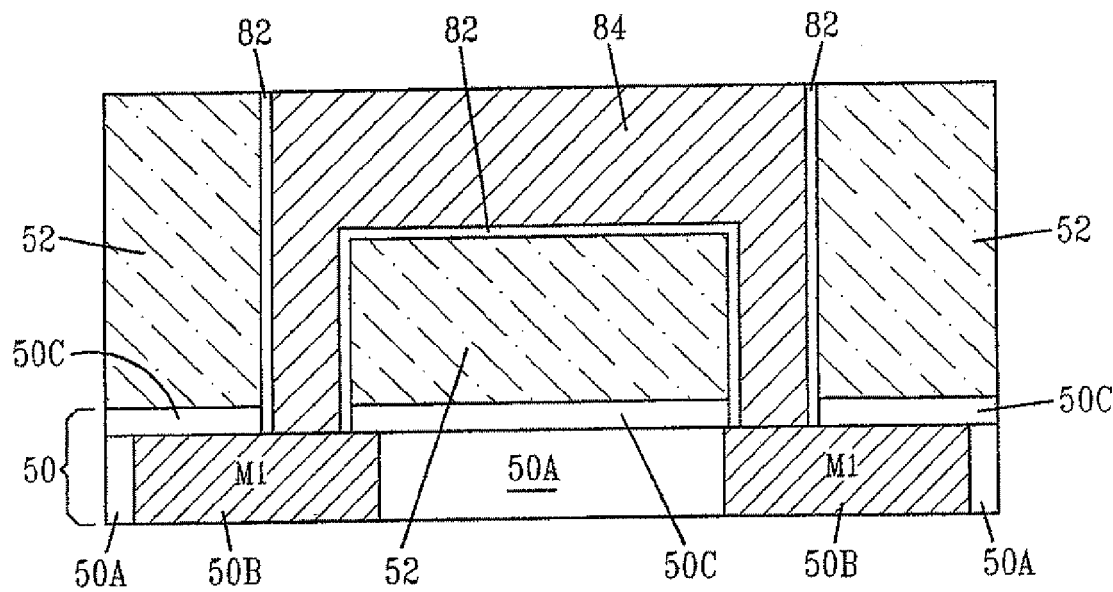

The next layer of the inventive hardmask 54, which is located either atop the second Si-containing inorganic layer 56 (as shown in the present embodiment) or atop the OSG ILD 52 (as shown in FIGS. 4A-4B), is an organic material layer 58 which is formed in the same or different, preferably the same, reactor chamber as the OSG ILD 52 and the optional second Si-containing inorganic layer 56. The organic material layer 58 comprises any C-containing material (crystalline or amorphous) including, for example, diamond like carbon (DLC), amorphous carbon, hydrogenated forms of these materials, or a spin applied organic polymer. In one preferred embodiment, the organic material layer 58 is applied by CVD. The organic material layer 58 is formed by selecting at least one C-containing precursor such as cyclohexane or other cyclic hydrocarbon that is capable of forming an organic material layer 58. Virtually any alkane, alkene or alkyne hydrocarbon may be used. The organic material layer 58 typically has a thickness from about 50 to about 500 nm, with a thickness from about 100 to about 300 nm being more typical. The term "DLC" is used herein to denote a hydrogenated carbon material that has properties that are similar to diamond, although other C based materials may also be used within the invention.

Next, a first Si-containing inorganic layer 60 comprising a nitride underlayer 62 and an oxide overlayer 64 is formed in the same or different, preferably the same, reactor chamber as the other layers of the inventive hardmask 54 and the OSG ILD 52. The nitride under layer 62 comprises one of SiN, SiON or an amorphous material comprising Si and N and optionally O, while the oxide overlayer 64 comprises silicon oxide or an amorphous material containing at least Si and O. The second Si-containing inorganic layer typically has a dielectric constant between 2.6 to 3.5.

The first upper Si-containing inorganic layer 60 is formed by selecting suitable precursors and then utilizing one of the above mentioned deposition processes. For example, silane $SiH_4$ and ammonia $NH_3$ can be used for forming a SiN layer, and $O_2$ can be added to these precursors when forming a SiON layer. Either silane and $O_2$, or tetraethylorothosilicate (TEOS) can be used for forming a silicon oxide layer. The first upper Si-containing inorganic layer 60 has a total thickness (sum of layers 62 and 64) from about 50 to about 300 nm, with a thickness from about 80 to about 150 nm being more typical.

Following deposition of the first upper Si-containing inorganic layer 60, a first anti-reflective coating (ARC) 66 is deposited. The ARC may be deposited using the same or different, preferably the same, reactor chamber as that of the other layers shown in FIG. 2A. Alternatively the ARC 66 may be spin coated. The ARC 66 is preferably comprised of a conventional organic anti-reflective coating material, because a larger etch process window is obtained with an organic ARC. Within the invention, an inorganic ARC may be used. The ARC 66 typically has a thickness from about 40 to about 150 nm.

Next, a photoresist 68 is formed on the ARC 66 by spin coating of a conventional resist material, and the photoresist 68 is patterned by lithography. The lithographic step includes exposing the applied resist material to a pattern of radiation and developing the exposed resist material utilizing a conventional resist developer. In the present invention, a line pattern 70 is formed into the applied resist material.

Figure 2B:
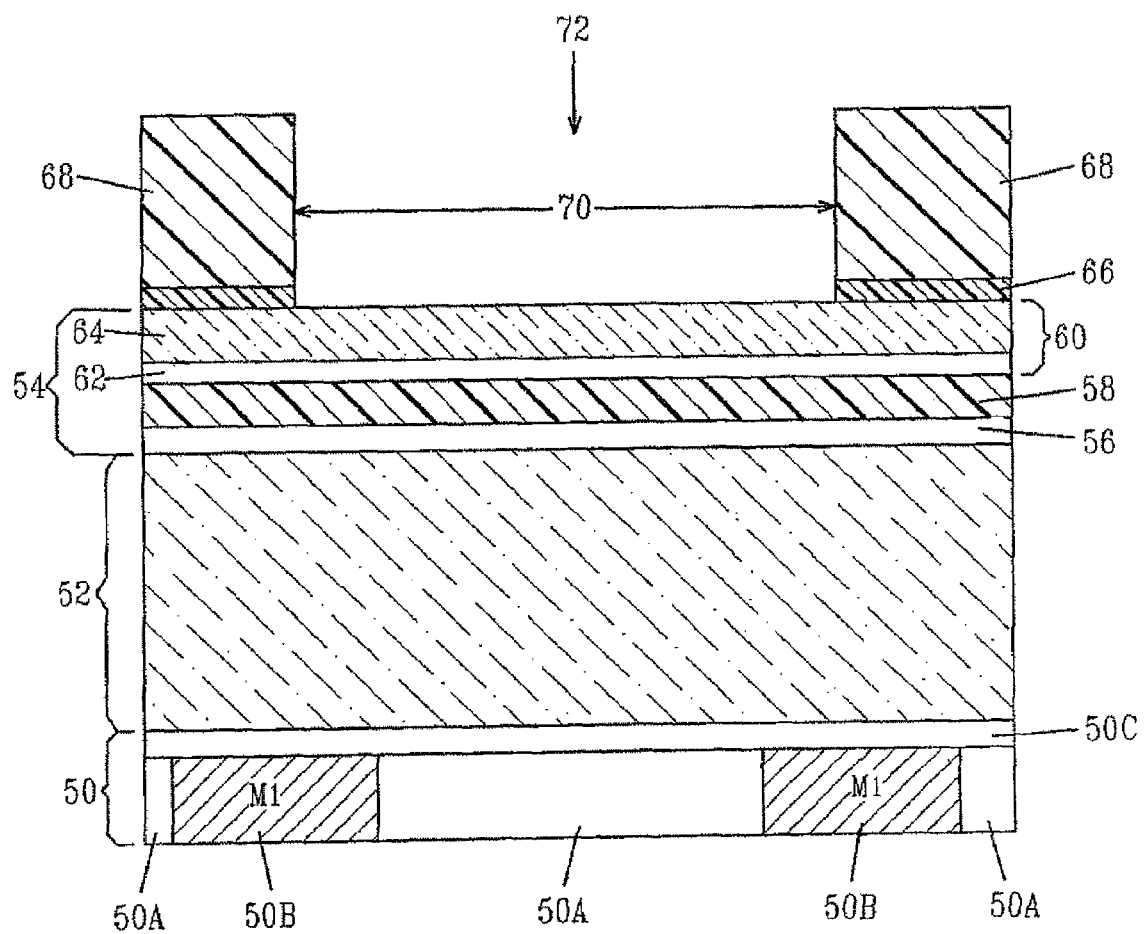

Next, and as shown in FIG. 2B, a first opening 72, i.e., line opening, is formed by utilizing a line lithography step in which the line pattern 70 defined by the patterned photoresist 68 is transferred to the ARC 66. After performing the line lithography step, a portion of the oxide overlayer 64 of the second Si-containing inorganic layer 60 is exposed, while a remaining portion of the oxide overlayer 64 is protected by the patterned photoresist 68 and patterned ARC 66. Note during the line lithography step, the patterned photoresist 68 is typically thinned.

After this line lithographic step, the line pattern 70, i.e., first pattern, defined by the first opening 72 is transferred into the exposed portion of oxide overlayer 64 stopping on the surface of nitride underlayer 62 utilizing an etching step that selectively removes oxide as compared with nitride and resist material. The patterned photoresist 68 and the ARC 66 are then removed utilizing the same or different, preferably the same, stripping process which is capable of removing these organic material layers from the structure. For example, an oxygen plasma process can be used to remove these organic material layers from the structure.

Figure 2C:
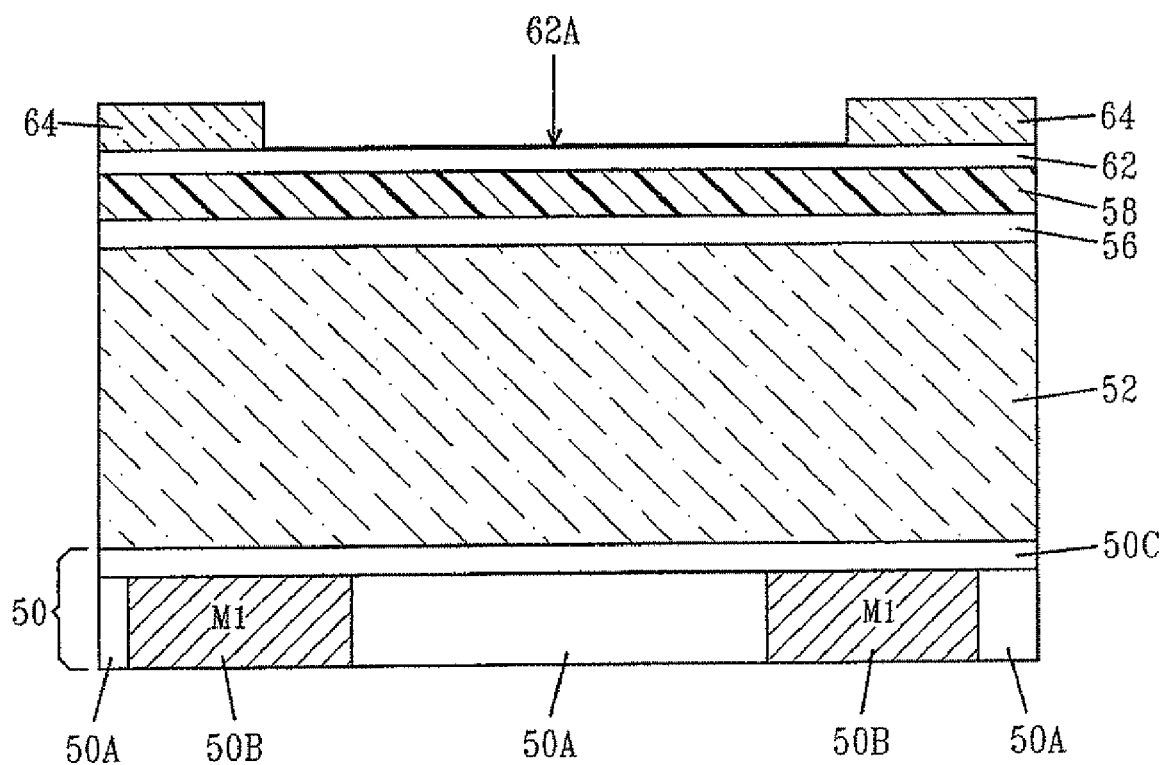
Figure 2D:
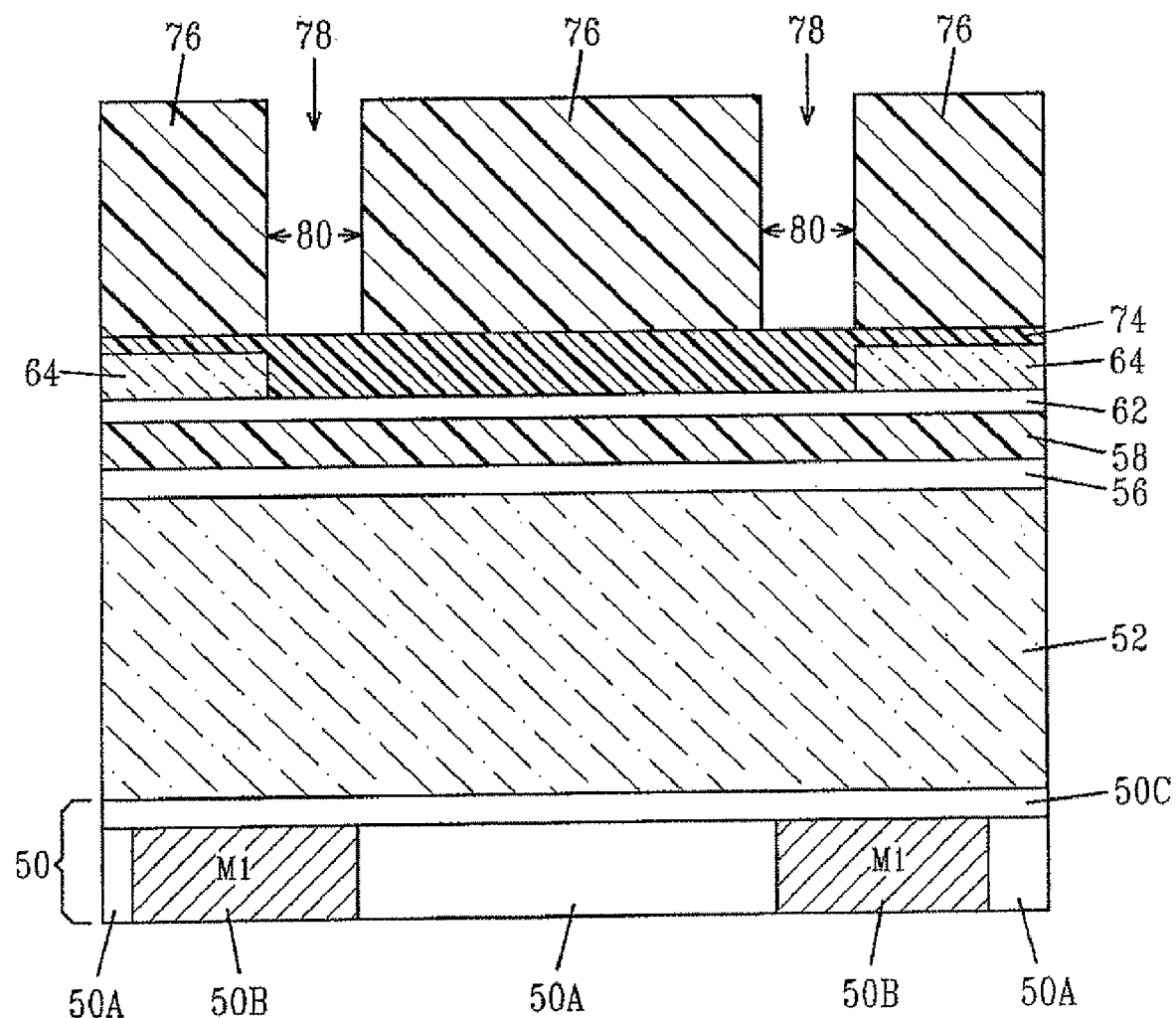

During the stripping of the organic layers 66 and 68 and when an oxygen plasma is used, the exposed portion of the nitride underlayer 62 is conditioned to prevent resist poisoning in a subsequent lithographic process. In another embodiment of the present invention, the exposed portion of the nitride underlayer 62 is conditioned in a separate step from the stripping of the patterned photoresist 68 and the ARC 66. The conditioning step forms a surface SiON region 62A on the exposed portion of the nitride underlayer 62, not protected by the patterned oxide overlayer 64, and removes amine species from region 62A The resultant structure is shown in FIG. 2C. In the embodiment in which the nitride underlayer 62 is comprised of SiON, the conditioning step provides an enriched SiON surface region, again without amine species that can cause photoresist poisoning in the next lithography step. For the sake of clarity, the surface SiON region 62A is not shown in the remaining drawings of the present application.

Next, a second ARC 74 is applied to the surface of the structure shown in FIG. 2C and then a second patterned photoresist 76 have at least one second opening 78 comprising a second pattern, i.e., a via pattern, 80 is formed atop the second ARC 74. The second ARC 74 can be the same or different material as that of the first ARC 66 and it is applied by a conventional deposition process such as spin-on coating. The patterned photoresist 76 is formed by lithography including resist material exposure and development. The resultant structure including the second ARC 74 and the second patterned photoresist 76 is shown, for example, in FIG. 2D.

Figure 2E:
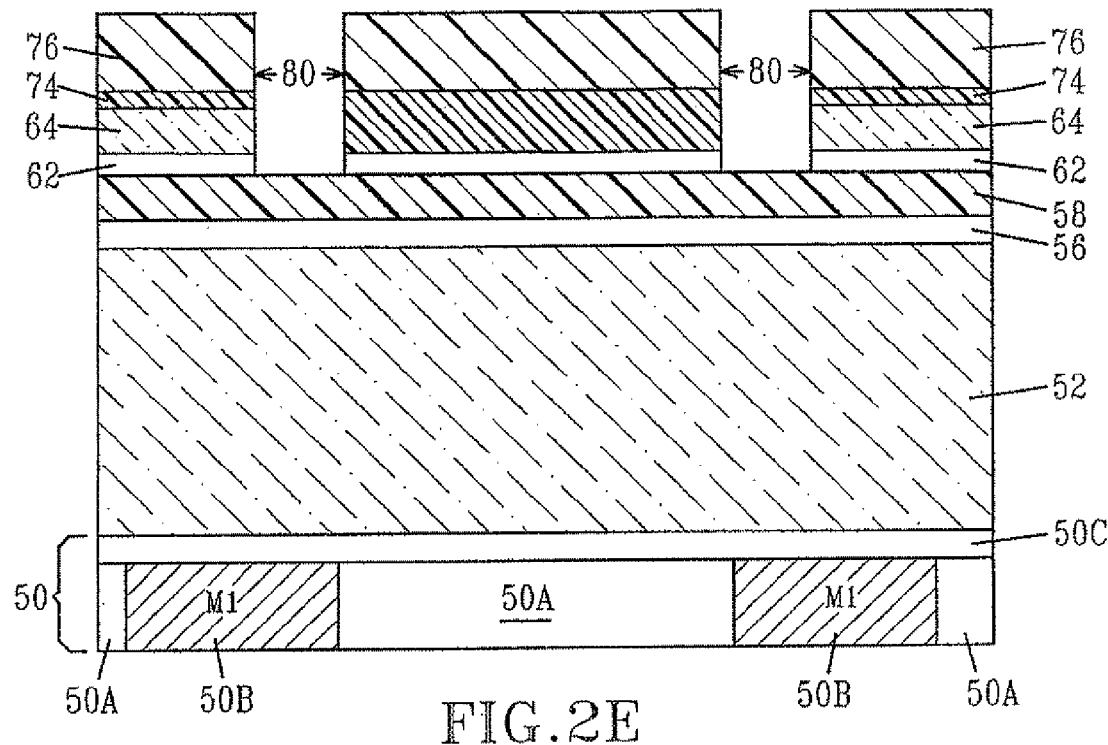
Figure 2F:
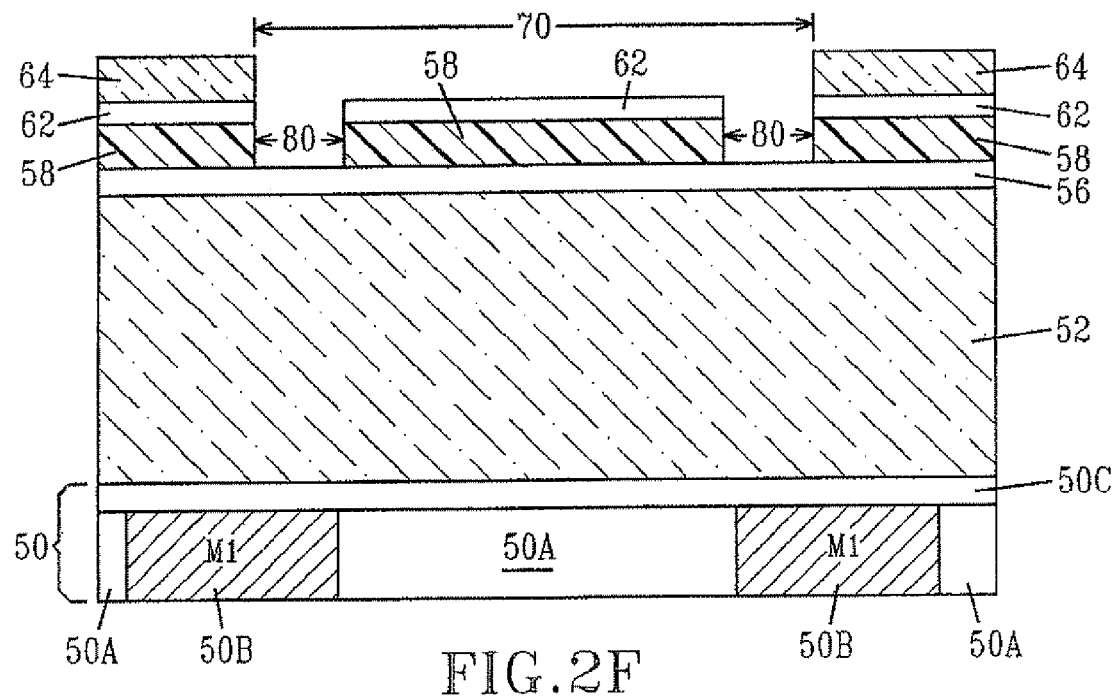
Figure 2G:
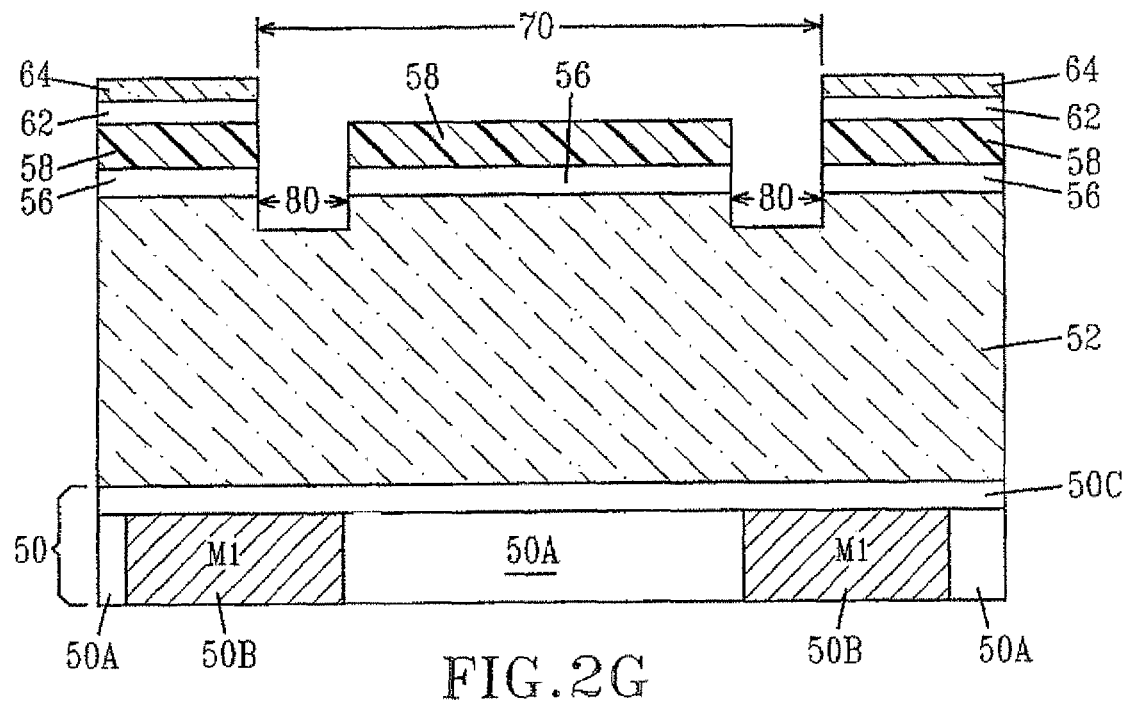

FIG. 2E shows the structure after the via pattern 80 has been transferred into portions of the nitride underlayer 62 using the patterned photoresist 76 as the pattern transfer layer. Specifically, the transfer of the via pattern 80 into the nitride underlayer 62 is performed utilizing an etching process that selectively removes nitride stopping atop the first organic material layer 58. Note that during this step of the present invention, the exposed portions of the ARC coating 74, not protected by the patterned photoresist 76, is removed prior to removing the underlying portions of the nitride underlayer 62. Also, the etch used in transferring the via pattern 80 into the nitride underlayer 62 thins the patterned photoresist 76.

Next, the exposed portion of the organic material layer 58 is then opened utilizing an etching process that selectively removes the exposed organic material layer 58, while stopping on either the first Si-containing inorganic layer 56, if present, or the OSG ILD 52. Note that during this etching step in which the via pattern 80 is transferred into the organic material layer 58 the patterned photoresist 76 and the second ARC 74 are typically removed. In some embodiments, the patterned photoresist 76 and the second ARC 74 are removed utilizing a different etching step than that used to transfer the via pattern 80 into the organic material layer 58. The resultant structure including the opened organic material layer 58 is shown, for example, in FIG. 2F.

Next, the line pattern transfer 70 is completed by commencing with the opening of the first Si-containing inorganic layer 56. The opening of the first Si-containing inorganic layer 56 includes a selective etching process that removes the exposed Si-containing inorganic material. During this etch, a portion of the oxide overlayer 64 is thinned, while the exposed nitride underlayer 62 in areas adjoining the via pattern 80 is removed. Transferring of the via pattern 80 into the OSG ILD 52 follows the completion of the line pattern 70 transfer. The resultant structure is shown, for example, in FIG. 2G. This structure is formed utilizing an etching step that selectively removes the exposed portions of the first Si-containing inorganic layer 56.

Figure 2H:
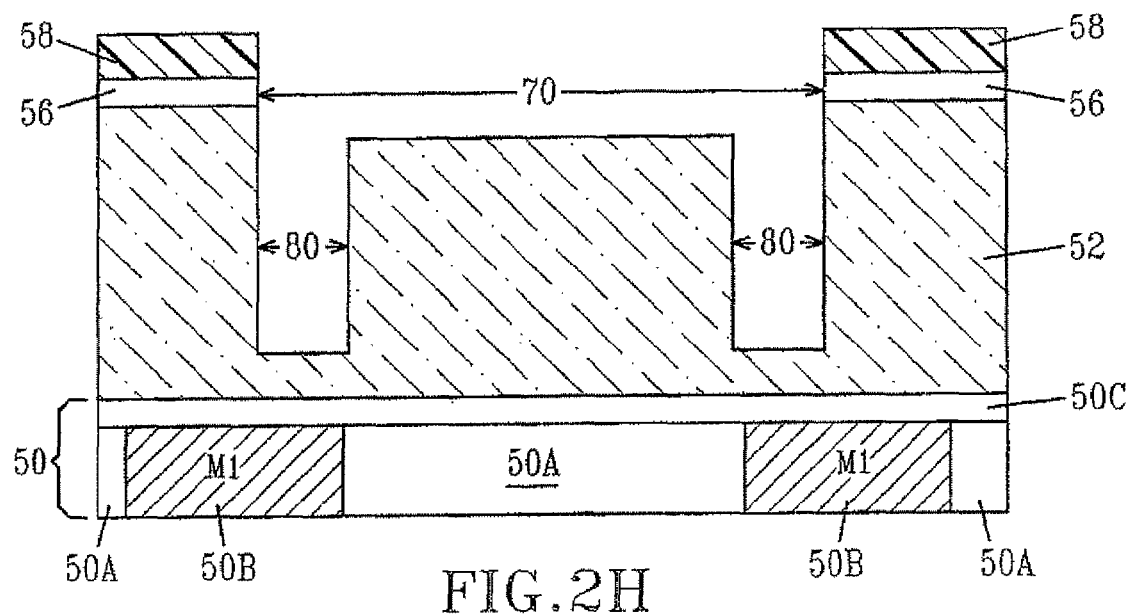

FIG. 2H shows the structure after deepening the via pattern 80 into the OSG ILD 52 utilizing an etch that selectively removes the OSG ILD 52. During this deepening process, the oxide overlayer 64 and the nitride underlayer 62 of the first Si-containing inorganic layer 60 are removed.

Figure 2I:
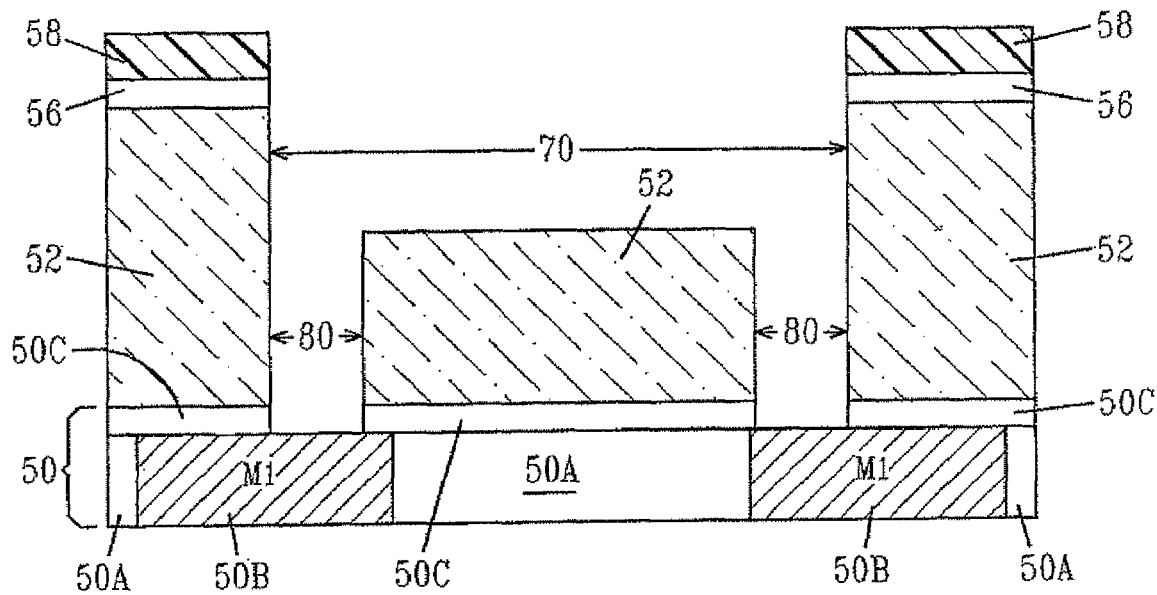

A timed etching process such as RIE is then employed to define the line pattern 70 height. FIG. 2I shows a structure after performing the timed etch in which the diffusion barrier 50C is opened stopping on the surface of the conductive features 50B.

Figure 2J:
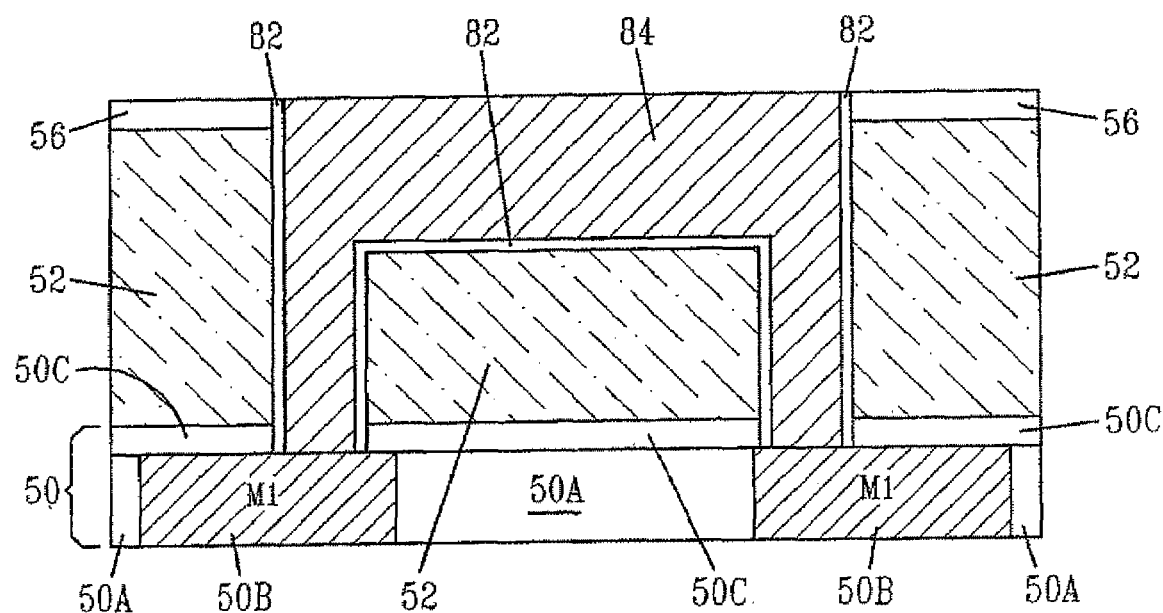

FIG. 2J shows the structure that is formed after at least one liner 82 and a conductive material 84 have been formed into the structure shown in FIG. 2I. The at least one liner 82 is formed on all exposed surfaces (vertical and horizontal) within the openings created above. The at least one liner 82 is formed by any deposition process including, but not limited to: CVD, PECVD, sputtering, chemical solution deposition or plating. The at least one liner 82 is comprised of any material that can serve as a barrier to prevent a conductive material 84 from diffusing there through. Illustrative examples of such barrier materials include a refractory metal, such as Ta, Ti, W, Ru, or nitrides thereof, e.g., TaN, TiN, WN. The at least one liner 82 may also comprise TiNSi. The thickness of the at least one liner 82 is typically from about 1 to about 60 nm, with a thickness from about 5 to about 40 nm being more typical.

In some embodiments, as shown, it is possible to remove the at least one liner 82 from the bottom wall of the via pattern 70 to provide an interconnect structure having an open via bottom. When an open via bottom structure is desired, an ion bombardment or other like directional etching process is employed.

Next, a conductive material 84 is deposited within the openings. The conductive material 84 comprises polySi, a conductive metal, an alloy comprising at least one conductive metal, a conductive metal silicide or combinations thereof. Preferably, the conductive material 84 is a conductive metal such as Cu, W, or Al. In one highly preferred embodiment, the conductive material 84 is comprised of Cu. The conductive material 84 is formed within the openings utilizing a conventional deposition process including, but not limited to: CVD, PECVD, sputtering, chemical solution deposition or plating. After deposition, a planarization process can be employed such that the upper surface of the conductive material 84 is substantially coplanar with either the upper surface of the OSG ILD 52 or, as shown, the upper surface of the first Si-containing inorganic layer 56. The conductively filled opening can be referred to herein as a conductive feature that is embedded within the OSG ILD 52.

Figure 3A:
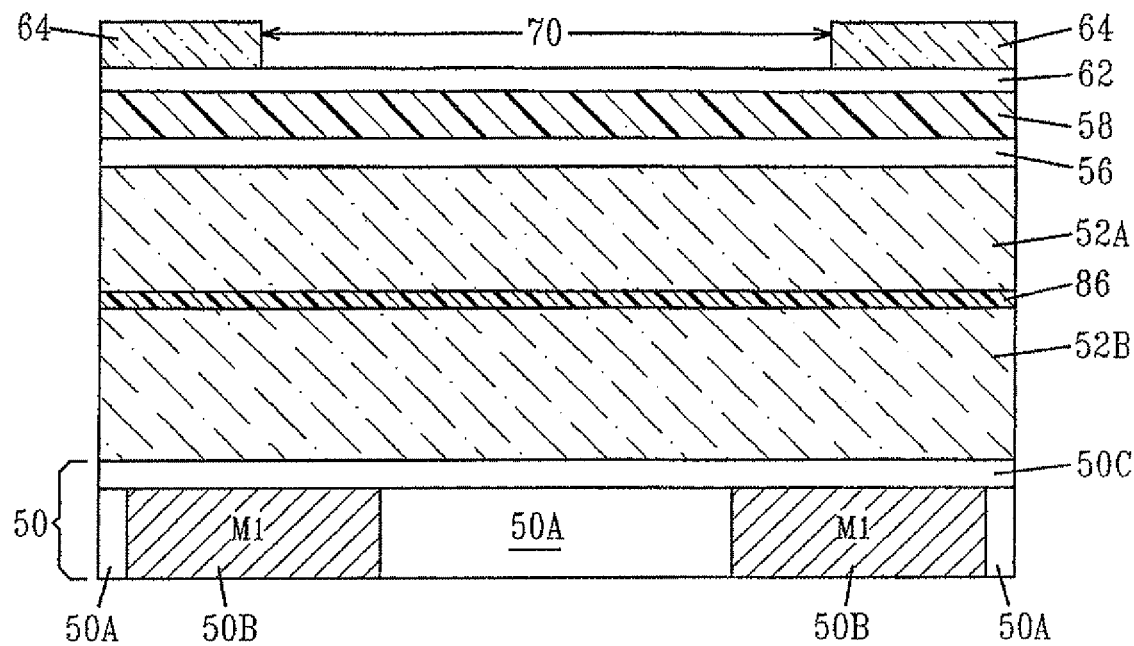
FIGS. 3A-3B are pictorial representations (through cross sectional views) illustrating processing steps employed in a second embodiment of the present invention in which a multilayer hardmask comprising four layers is used and a buried etch stop layer is located between first and second OSG layers.
Figure 3B:
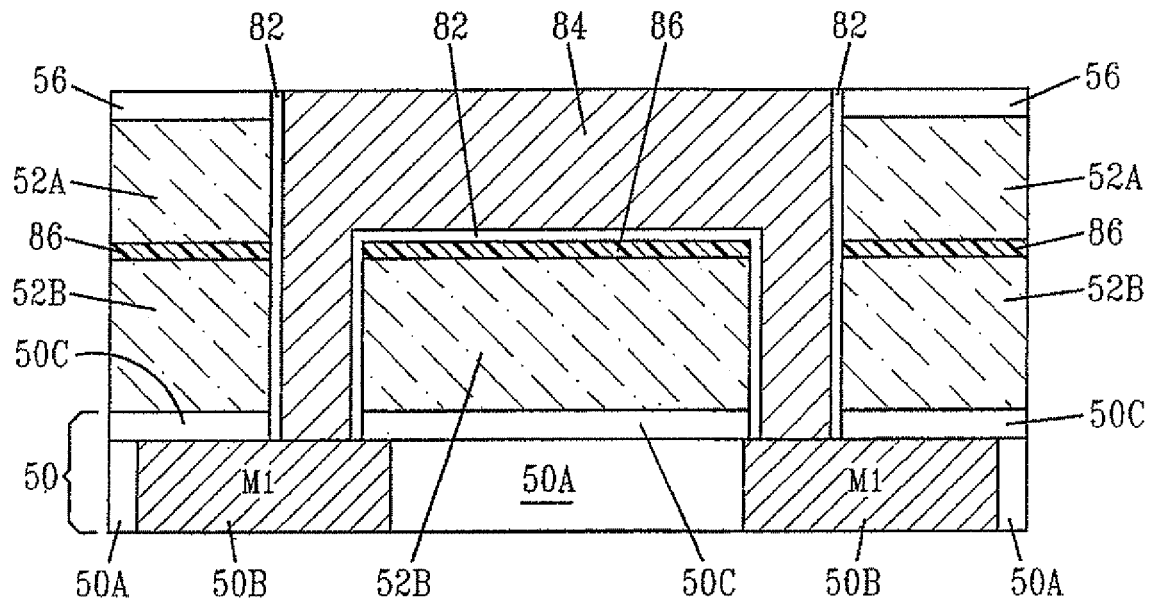

FIGS. 3A-3B illustrate an embodiment of the present invention in which the OSG ILD comprises a stack of OSG ILD 52A and 52B, respectively, which are separated by a buried etch stop layer 86. The stack may comprise the same or different OSG ILD material. The buried etch stop layer 86 is comprised of a silicon oxide, nitride, oxynitride, carbide or a multilayer thereof and it is formed between the OSG ILD by a conventional deposition process. Organic as well as inorganic materials can be used as the buried etch stop layer 86. The thickness of the buried etch stop layer 86 can vary and is not critical to the inventive process.

The structure shown in FIG. 3A includes the inventive multilayer hardmask 54 through the definition of the partial line pattern 70 in the oxide overlayer 64, while FIG. 3B shows the final structure after performing the various patterning steps and filling procedure described above in the first embodiment of the present invention.

FIGS. 4A-4B shows a third embodiment of the present invention in which the first Si-containing inorganic layer 56 is omitted from the multilayer hardmask 54. FIG. 4A shows the structure after partial line opening 70, while FIG. 4B shows the structure after performing the various patterning and filling steps described in the first embodiment of the present invention, and is distinct from FIG. 2J in that layer 56 is not present in FIG. 4B.

The above processing may be repeated any number of times to provide a multilevel interconnect structure. Although the multilevel interconnect structure is not limited to any number, current technologies has from about 2 to about 10 interconnect levels.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A process for damage-free patterning of at least one organosilicate glass interlevel dielectric (OSG ILD) comprising:
    forming a structure comprising a multilayer hardmask on a surface of an OSG ILD, said multilayer hardmask comprising an organic material layer, and a first Si-containing inorganic material layer located atop the organic material layer, wherein said first Si-containing inorganic layer comprises a stack of at least an oxide overlayer and a nitride underlayer;
    forming a first opening defining a partial line pattern in said oxide overlayer, wherein said first opening exposes a portion of said nitride underlayer;
    conditioning the exposed portion of said nitride underlayer to prevent resist poisoning;
    forming a second opening defining a via pattern through said exposed portion of the nitride underlayer, said organic material layer and a portion of said OSG ILD;
    completing the line pattern by removing said nitride overlayer, said organic material layer, and a portion of said OSG ILD that is adjacent to said via pattern;
    deepening the via pattern through said OSG ILD; and
    filling said via and line patterns within said OSG ILD with at least a conductive material.

2. The method of claim 1 further comprising a second Si-containing inorganic layer beneath said organic material layer.

3. The method of claim 2 wherein said second Si-containing inorganic layer comprises atoms of at least Si, C or H, and has a dielectric constant between 2.6 to 3.5.

4. The method of claim 1 wherein said organic material layer comprises a C-containing material.

5. The method of claim 1 wherein said organic material layer comprises diamond like carbon, amorphous carbon, or an organic polymer.

6. The method of claim 1 wherein said nitride underlayer comprises SiN, SiON or an amorphous material comprising elements of Si and N.

7. The method of claim 1 wherein said oxide overlayer comprises silicon oxide or an amorphous material comprising Si and O.

8. The method of claim 1 wherein said at least one OSG ILD comprises a stack of OSG materials having a buried etch stop layer located therebetween.

9. The method of claim 1 further comprising a substrate located beneath said OSG ILD.

10. The method of claim 9 wherein said substrate is a semiconducting material, an insulating material, a conductive material, or combination including multilayers thereof.

11. The method of claim 1 wherein said conductive material comprises polySi, a conductive metal, an alloy comprising at least one conductive metal, a conductive metal silicide or combinations thereof.

12. The method of claim 3 wherein said second Si-containing inorganic layer further comprises O and N.

* * * * *